(12) United States Patent
Taghivand et al.

(10) Patent No.: US 10,128,823 B2
(45) Date of Patent: Nov. 13, 2018

(54) SUBTHRESHOLD METAL OXIDE SEMICONDUCTOR FOR LARGE RESISTANCE

(71) Applicant: QUALCOMM Incorporated, San Diego, CA (US)

(72) Inventors: Mazhareddin Taghivand, Campbell, CA (US); Yashar Rajavi, Mountain View, CA (US); Alireza Khalili, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 14/642,309

(22) Filed: Mar. 9, 2015

(65) Prior Publication Data
US 2016/0173072 A1 Jun. 16, 2016

Related U.S. Application Data

(60) Provisional application No. 62/089,927, filed on Dec. 10, 2014.

(51) Int. Cl.
*H03L 5/00* (2006.01)
*H03K 5/08* (2006.01)
(Continued)

(52) U.S. Cl.
CPC ............. *H03K 5/08* (2013.01); *H03H 11/245* (2013.01); *H03H 1/02* (2013.01)

(58) Field of Classification Search
CPC ... H03K 5/00; G02F 2203/00; G02F 2203/62; H03G 11/00; H03G 11/02; H03G 11/04; H03G 11/08
(Continued)

(56) References Cited

U.S. PATENT DOCUMENTS 5,821,769 A 10/1998 Douseki
5,973,524 A 10/1999 Martin
(Continued)

OTHER PUBLICATIONS

Khateb F., et al., "Low-Voltage Ultra-Low-Power Current Conveyor Based on Quasi-Floating Gate Transistors," Radioengineering, Jun. 2012, vol. 21 (2), pp. 725-735.
(Continued)

*Primary Examiner* — Lincoln Donovan
*Assistant Examiner* — Diana J Cheng
(74) *Attorney, Agent, or Firm* — Patterson & Sheridan, L.L.P.

(57) ABSTRACT

Certain aspects of the present disclosure generally relate to generating a large electrical resistance. One example circuit generally includes a first transistor having a gate, a source connected with a first node of the circuit, and a drain connected with a second node of the circuit. The circuit may also include a voltage-limiting device connected between the gate and the source of the first transistor, wherein the device, if forward biased, is configured to limit a gate-to-source voltage of the first transistor such that the first transistor operates in a sub-threshold region. The circuit may further include a second transistor configured to bias the voltage-limiting device with a current, wherein a drain of the second transistor is connected with the gate of the first transistor, a gate of the second transistor is connected with the first node, and a source of the second transistor is connected with an electric potential.

25 Claims, 6 Drawing Sheets

(51) Int. Cl.
*H03H 11/24* (2006.01)
*H03H 1/02* (2006.01)

(58) Field of Classification Search
USPC .................. 327/306–321, 324, 327–328
See application file for complete search history.

(56) References Cited

U.S. PATENT DOCUMENTS

| | | | | |
|---|---|---|---|---|
| 5,999,043 | A * | 12/1999 | Zhang | H03H 1/02 |
| | | | | 327/308 |
| 6,753,726 | B1 | 6/2004 | Drost et al. | |
| 7,268,858 | B2 | 9/2007 | Kuijk et al. | |
| 8,054,156 | B2 | 11/2011 | Fort et al. | |
| 8,898,356 | B2 * | 11/2014 | Julicher | G06F 13/10 |
| | | | | 710/20 |
| 9,104,223 | B2 * | 8/2015 | Zhong | G05F 3/08 |
| 2002/0075056 | A1 | 6/2002 | Sauer | |
| 2004/0108521 | A1 * | 6/2004 | Lim | G11C 11/406 |
| | | | | 257/200 |
| 2008/0136509 | A1 | 6/2008 | Timm et al. | |

OTHER PUBLICATIONS

International Search Report and Written Opinion—PCT/US2015/059451—ISA/EPO—Jan. 29, 2016.
Kassiri H., et al., "Low-distortion Super-GOhm Subthreshold-MOS resistors for CMOS Neural Amplifiers," 2013 IEEE Biomedical Circuits and Systems Conference (BIOCAS), IEEE, Oct. 31, 2013, XP032528865, pp. 270-273, DOI: 10.1109/BIOCAS.2013.6679691 [retrieved on Dec. 9, 2013].

* cited by examiner

SUBTHRESHOLD METAL OXIDE SEMICONDUCTOR FOR LARGE RESISTANCE

CROSS-REFERENCE TO RELATED APPLICATION

This application claims the benefit of U.S. Provisional Patent Application Ser. No. 62/089,927, filed Dec. 10, 2014 and entitled "SUBTHRESHOLD METAL OXIDE SEMICONDUCTOR FOR LARGE RESISTANCE," which is herein incorporated by reference in its entirety.

TECHNICAL FIELD

Certain aspects of the present disclosure generally relate to electronic circuits and, more particularly, to circuits for generating and utilizing a large electrical resistance value.

BACKGROUND

Electrical resistance is the opposition of current flow through a medium. Electrical resistance is used in various electric circuits and may be generated in several different ways. Carbon, film, and wire-wound resistors are just a few examples of the available resistor types. However, some of these resistor types may not be practical for generating large resistance values in an integrated circuit (IC). Instead, materials such as poly-silicon may be used to limit the flow of current between two nodes in an IC. In addition, transistors also have resistive characteristics. For example, electrical resistance may exist between a drain and source terminal of a metal-oxide-semiconductor field-effect transistor (MOSFET). This resistance may be modified by controlling the gate-to-source voltage ($V_{GS}$) of the MOSFET such that the transistor is operated in the triode region.

SUMMARY

Certain aspects of the present disclosure generally relate to generating and utilizing a large electrical resistance. As used herein, a large electrical resistance generally refers to a resistance greater than 1 MΩ.

Certain aspects of the present disclosure provide a circuit having a large electrical resistance. The circuit generally includes a first transistor having a gate, a source connected with a first node of the circuit, and a drain connected with a second node of the circuit; a voltage-limiting device connected between the gate and the source of the first transistor, wherein the device, if forward biased, is configured to limit a gate-to-source voltage ($V_{GS}$) of the first transistor such that the first transistor operates in a subthreshold region; and a second transistor configured to bias the voltage-limiting device with a current, wherein a drain of the second transistor is connected with the gate of the first transistor, a gate of the second transistor is connected with the first node, and a source of the second transistor is connected with an electric potential.

According to certain aspects, the voltage-limiting device comprises a diode-connected transistor. For certain aspects, a gate and a drain of the diode-connected transistor are connected with the gate of the first transistor, and a source of the diode-connected transistor is connected with the source of the first transistor. For certain aspects, the source and a bulk of the diode-connected transistor are connected together.

According to certain aspects, the source and a bulk of the first transistor are connected together.

According to certain aspects, the circuit further includes a third transistor connected in parallel with the first transistor. A gate of the third transistor may be configured to control bypassing of the first transistor. For certain aspects, a bulk and a source of the third transistor are connected together.

According to certain aspects, the circuit further includes a capacitor connected between the second node and an electrical ground. For certain aspects, the circuit comprises a filter, the first node is an input of the filter, and the second node is an output of the filter.

According to certain aspects, the electric potential is an electrical ground. For other aspects, the electric potential may be a different reference voltage. For example, the electric potential may be a power supply voltage.

According to certain aspects, the first transistor is a PMOS transistor. For certain aspects, the voltage-limiting device is composed of a diode-connected PMOS transistor. In this case, the second transistor may be an NMOS transistor. For certain aspects, the voltage-limiting device comprises a diode having an anode connected with the source of the first transistor and a cathode connected with the gate of the first transistor.

According to certain aspects, the first transistor is an NMOS transistor. For certain aspects, the voltage-limiting device is composed of a diode-connected NMOS transistor. In this case, the second transistor may be a PMOS transistor. For certain aspects, the voltage-limiting device comprises a diode having an anode connected with the gate of the first transistor and a cathode connected with the source of the first transistor.

Certain aspects of the present disclosure provide a method for generating a large electrical resistance. The method generally includes providing a first transistor having a gate, a source connected with a first node of a circuit, and a drain connected with a second node of the circuit; controlling a second transistor to source or sink a current, wherein: a drain of the second transistor is connected with the gate of the first transistor; a gate of the second transistor is connected with the first node of the circuit; and a source of the second transistor is connected with an electric potential; and forward biasing a voltage-limiting device with the current, wherein the voltage-limiting device is connected between the gate and the source of the first transistor and wherein the voltage-limiting device is configured to limit a $V_{GS}$ of the first transistor when forward biased, such that the first transistor operates in a sub-threshold region.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

Example Subthreshold Metal Oxide Semiconductor (MOS) for Large Resistance

In many radio frequency integrated circuit (RFIC) blocks and other circuits, designers use resistor-capacitor (RC) filters for different reasons. For example in a phase-locked loop (PLL), RC filters are used extensively to filter noise. However, to filter very low frequency noise, a very high RC time constant may be used by either having a large electrical resistance (R) value in the megaohms (MΩ) or a large capacitance (C) value in the tens of picofarads (pF). However, large-valued R and C components typically take up considerable amounts of integrated circuit (IC) real estate. Typically, it is advantageous to increase the resistance rather than the capacitance, because the resistor surface area has a better trade-off than the capacitor surface area for the same RC time constant.

Figure 1A:
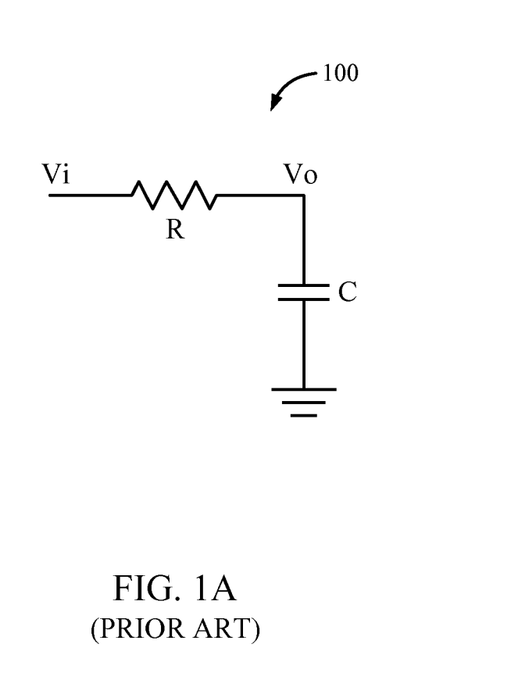
FIG. 1A is a prior art circuit diagram of an example resistor-capacitor (RC) circuit, which may use a poly-silicon resistor to generate a large resistance value.
Figure 1B:
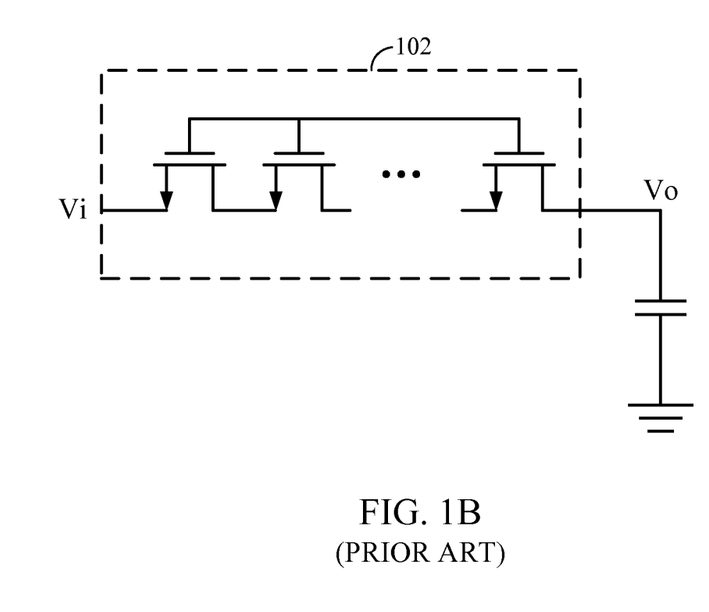
FIG. 1B is a prior art circuit diagram implementing the RC circuit of FIG. 1A, where the resistor is replaced with an array of cascaded transistors.

For example, as illustrated in the RC circuit diagram 100 of FIG. 1A, a large-valued poly-silicon (poly) resistor R may be used (e.g., having a resistance value on the order of 20 MΩ). However, as discussed above, the poly-resistor R may take up a significant amount of area in an IC. As an alternative, a large resistance value may be attained by cascading transistors 102 (e.g., NMOS or PMOS) operating in the triode region as illustrated in FIG. 1B. With the transistors cascaded in series, the resistance values from each transistor may be summed to obtain a total resistance value. However, in order to obtain a large total resistance value, a large number of transistors may be used. Thus, cascading transistors to realize a large resistive value also takes up a substantial amount of IC real estate.

Accordingly, what is needed are techniques and apparatus for generating a large resistance value with reduced area consumption.

Certain aspects of the present disclosure provide a robust approach to replacing the large poly resistor, involving employing a tiny metal-oxide semiconductor (MOS) device that is biased in the sub-threshold region. The resistance of the MOS device can be controlled over process, voltage, and temperature (PVT). Using a MOS in sub-threshold as discussed herein may replace the use of poly resistors discussed above, which have large area overhead. Moreover, by using a MOS in sub-threshold, a lower capacitance may also be used in the RC filter because the MOS can have a much larger resistance value than poly resistors can offer, thereby potentially offering even greater area reduction.

Figure 2:
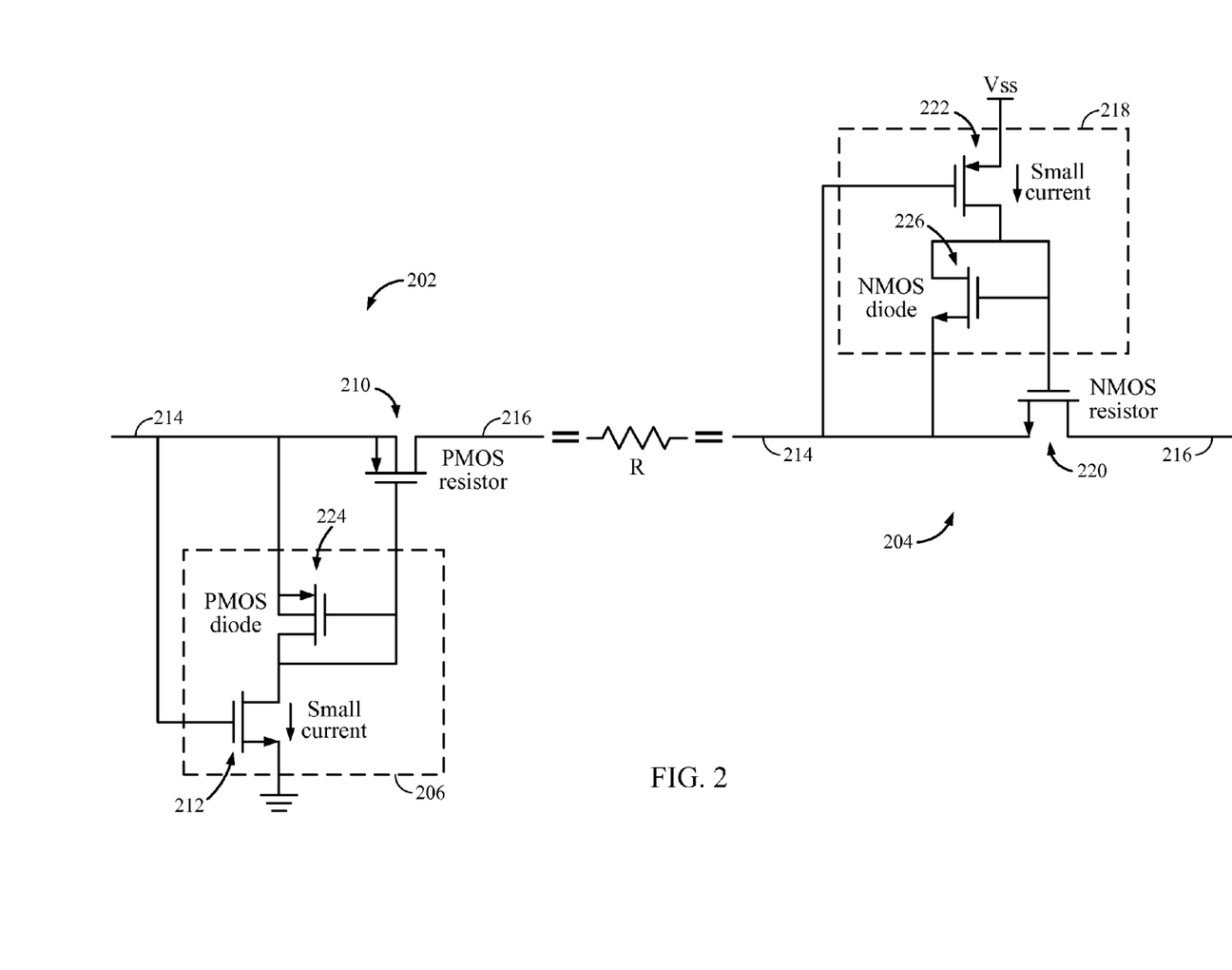
FIG. 2 provides example circuit diagrams of transistor configurations that function as resistors with large electrical resistance values, in accordance with certain aspects of the present disclosure.

FIG. 2 provides example circuit diagrams of transistor configurations that function as resistors with large electrical resistance values FIG. 2 illustrates an example circuit 202 that is equivalent to a resistor with a large electrical resistance value. The series resistance is generated with a p-channel MOS (PMOS) field-effect transistor (MOSFET) 210 (effectively a "PMOS resistor") operating in the sub-threshold region. For example, the source of the PMOS transistor 210 may be connected to a first node 214 (e.g., an input voltage node), while the drain may be connected to a second node 216 (e.g., an output voltage node). Thus, resistance between a drain and source of the PMOS transistor 210 may be used to attain high resistance between the first node 214 and the second node 216.

The PMOS transistor 210 may be biased in the sub-threshold region by a bias circuit 206 that is connected with the gate and source of the PMOS transistor 210. The bias circuit 206 may limit the voltage potential between the gate and source ($V_{GS}$) of the PMOS transistor 210 with a voltage-limiting device. In certain aspects, the voltage-limiting device may comprise a diode-connected PMOS transistor 224 (referred to as a "PMOS diode"), in which the gate and drain of the PMOS transistor 224 are shorted together. As illustrated in the circuit 202, the drain and gate of the PMOS transistor 224 may be connected with the gate of the PMOS transistor 210, while the source of the PMOS transistor 224 may be connected with the source of the PMOS transistor 210 and the first node 214. In certain aspects, the voltage-limiting device may comprise a diode (not illustrated) having an anode connected with the source of the PMOS transistor 210 and a cathode connected with the gate of the PMOS transistor 210.

Moreover, the bias circuit 206 may further comprise a current-limiting n-channel MOS (NMOS) transistor 212 having a drain connected with the drain of the PMOS transistor 224 and with the gate of the PMOS transistor 210 and a source connected with a reference potential (e.g., electrical ground). The gate of the current-limiting transistor 212 may be connected with the first node 214. The current-limiting transistor 212 may be configured to have a small drain-to-source current. In certain aspects, in an effort to reduce leakage current, a bulk and source of the PMOS transistor 210 may be connected together. Similarly, a bulk and source of the diode-connected PMOS transistor 224 may be connected together.

For other aspects, a large resistance may be generated using an NMOS transistor 220 operating in the sub-threshold region, as illustrated in circuit 204 of FIG. 2. The NMOS transistor 220 (effective an "NMOS resistor") may be connected between nodes 214 and 216. Similar to the circuit 202, a bias circuit 218 may be connected with the source and gate of the NMOS transistor 220 and utilized to bias the NMOS transistor 220 in the sub-threshold region.

The bias circuit 218 may limit the voltage potential between the gate and source ($V_{GS}$) of the NMOS transistor 220 with a voltage-limiting device. In certain aspects, the voltage-limiting device may comprise a diode-connected NMOS transistor 226 (referred to as an "NMOS diode"), in which the gate and drain of the NMOS transistor 226 are shorted together. A drain and gate of the NMOS transistor 226 may be connected with the gate of the NMOS transistor 220, while the source of the NMOS transistor 226 may be connected with the source of the NMOS transistor 220 and with the first node 214. In certain aspects, the voltage-limiting device may comprise a diode (not illustrated) having an anode connected with the gate of the NMOS transistor 220 and a cathode connected with the source of the NMOS transistor 220. Moreover, the bias circuit 218 may further comprise a current-limiting PMOS transistor 222 having a drain connected with the gate of the NMOS transistor 220 and a source connected with a power supply voltage (e.g., $V_{SS}$). The gate of the current-limiting PMOS transistor 222 may be connected with the first node 214. The current-limiting PMOS transistor 222 may be configured to have a small source-to-drain current. For certain aspects, a bulk and source of the NMOS transistor 222 may be connected together. Similarly, the bulk and source of the diode-connected NMOS transistor 226 may be connected together, although not shown in FIG. 2.

Figure 3:
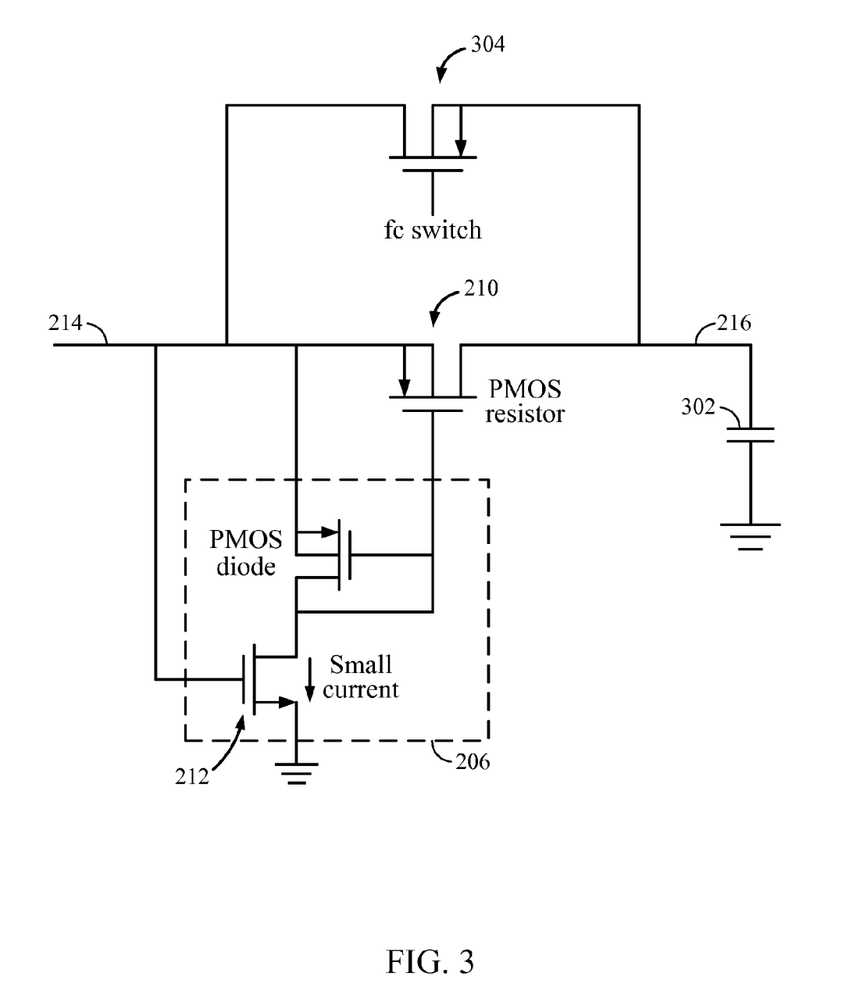
FIG. 3 is a circuit diagram of an example effective RC circuit having a PMOS transistor, a biasing circuit, and a fast charge switch, in accordance with certain aspects of the present disclosure.

Certain aspects of the present disclosure add a PMOS transistor 304 to the circuit 202, where the PMOS transistor 304 is configured to function as a fast charge (FC) switch and may be connected in parallel with the PMOS transistor 210, as illustrated in FIG. 3. For example, a source of the PMOS transistor 304 may be connected with the drain of the PMOS transistor 210, while a drain of the PMOS transistor 304 may be connected with the source of the PMOS resistor 210. The gate of the PMOS transistor 304 may be driven to bias the PMOS transistor 304 in a saturation (active) region in order to effectively short circuit and bypass the drain-to-source resistance of the PMOS transistor 210. Thus, by placing the PMOS transistor 304 in saturation, the capacitor 302 may be charged at an increased rate (hence the term "fast charge switch"). In certain aspects, a bulk and source of the PMOS transistor 304 may be connected together in an effort to reduce leakage current.

Figure 4:
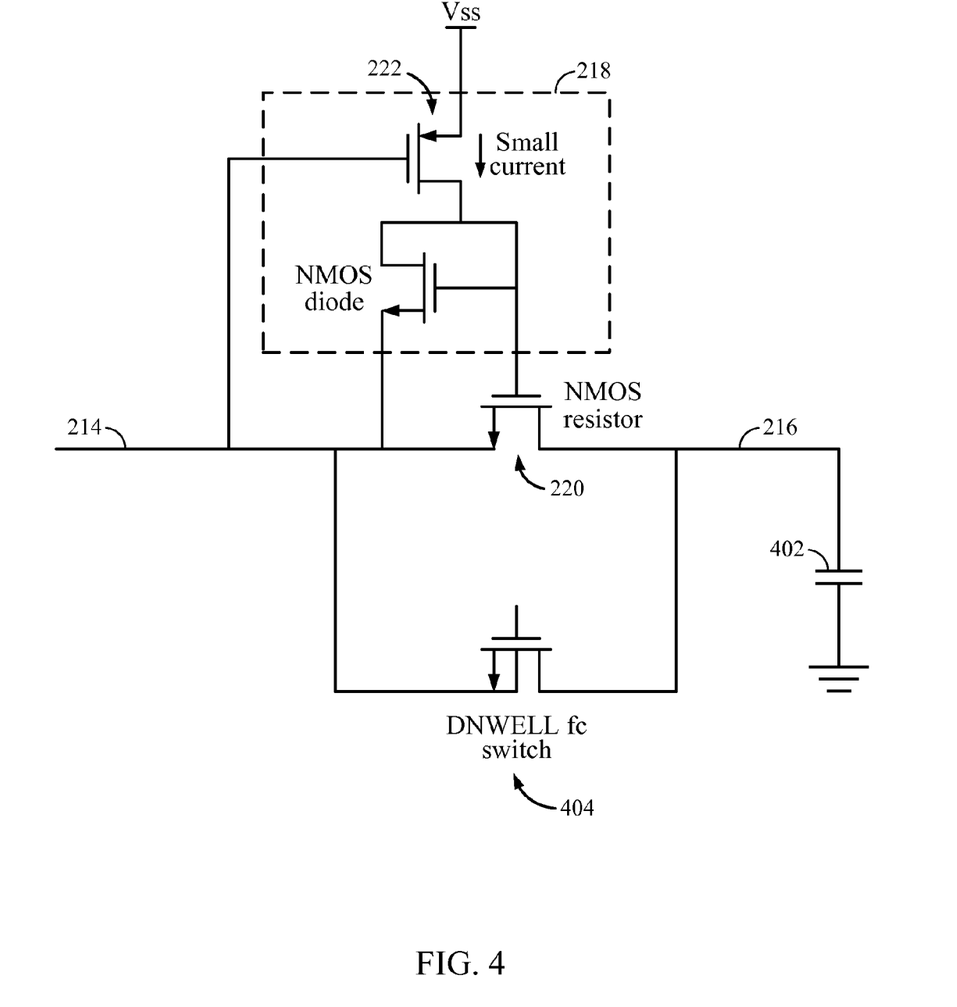
FIG. 4 is a circuit diagram of an example effective RC circuit having an NMOS transistor, a biasing circuit, and a fast charge switch, in accordance with certain aspects of the present disclosure.

Similarly, other aspects add an NMOS transistor 404 to the circuit 204, where the NMOS transistor 404 is configured to function as an FC switch and may be connected in parallel with the NMOS transistor 220, as illustrated in FIG. 4. In certain aspects, a source and a bulk of the NMOS transistor 404 may be connected together in an effort to reduce leakage current. Moreover, the NMOS transistor 404 may be a deep n-well NMOS transistor to reduce substrate leakage current.

Figure 5:
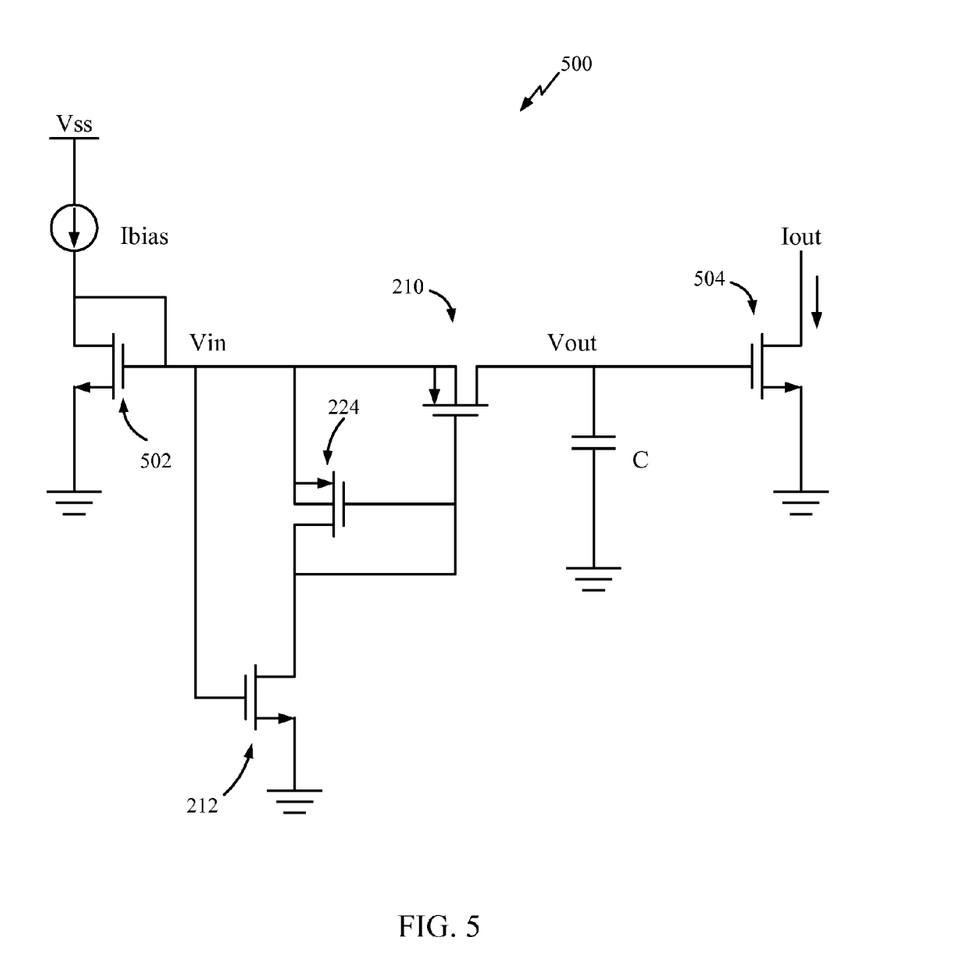
FIG. 5 is a circuit diagram of an example usage of the mainly PMOS configuration illustrated in FIG. 2 as the resistance in a low pass RC filter of a current mirror, in accordance with certain aspects of the present disclosure.

FIG. 5 is a circuit 500 illustrating an example usage of the circuit 202 as the resistance in a first order low-pass filter of a current mirror, in accordance with certain aspects of the present disclosure. A current mirror is a type of current amplifier that provides a high impedance output current proportional to an input current. The output current (Iout) is typically used to drive a load for high gain. A simple current mirror as shown in FIG. 5 generally consists of a pair of transistors 502, 504, with the gates of the pair being tied together and to an input voltage node at the drain of the input transistor 502. In FIG. 5, the gates of the transistors 502, 504 are connected with a low-pass filter with a large RC time constant, obtained via a large electrical resistance generated by a PMOS resistor operating in the sub-threshold region. This large RC time constant creates a pole having a very low cutoff frequency, such that noise and other high frequencies are shunted to ground via the capacitor C, whereas the gates of the transistors 502, 504 are effectively shorted together for low frequencies.

The sources of the transistors 502, 504 are connected to a reference voltage node (e.g., electrical ground in FIG. 5) that is common to both transistors. The drain and gate of the input transistor 502 are connected together and to a current source that provides a quiescent reference current (Ibias). Because the input and output transistors 502, 504 have their gates and sources tied together, a corresponding output current (Iout) arises in the conduction path of the output transistor 504. Generally, the input and output transistors 502, 504 are identical, and there is a substantially unity gain in the current. Such current mirrors are commonly used to provide active loads in high gain amplifier stages.

Figure 6:
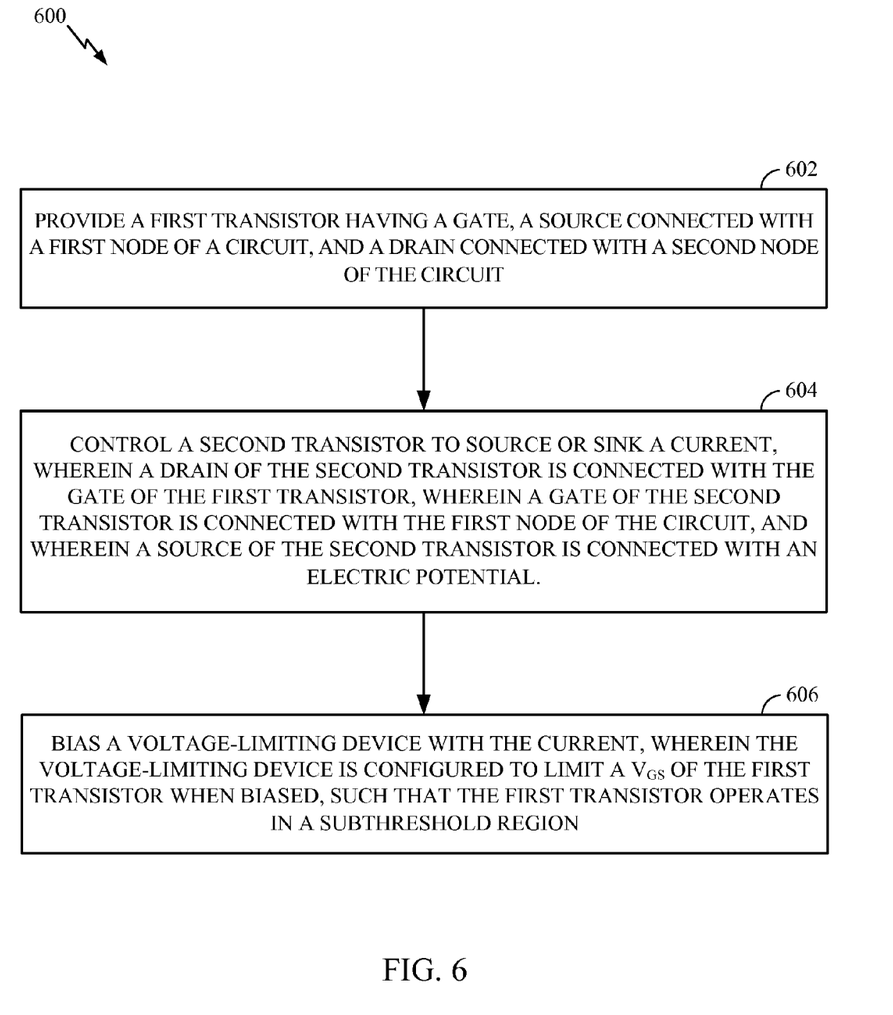
FIG. 6 is a flow diagram of example operations for generating a large electrical resistance, in accordance with certain aspects of the present disclosure.

FIG. 6 is a flow diagram of example operations 600 for generating a large electrical resistance between first and second nodes of a circuit, in accordance with certain aspects of the present disclosure. The operations 600 may be performed, for example, by any of the circuits described above, such as the circuits 202, 204.

The operations 600 may begin, at block 602, by providing a first transistor. The first transistor may have a gate, a source connected with a first node of a circuit, and a drain connected with a second node of the circuit.

At block 604, a second transistor may be controlled to source or sink a current. A drain of the second transistor may be connected with the gate of the first transistor, a gate of the second transistor may be connected with the first node of the circuit, and a source of the second transistor is connected with an electric potential (e.g., electrical ground or a power supply rail).

At block 606, a voltage-limiting device may be forward biased with the current. The voltage-limiting device may be connected between the gate and the source of the first transistor. The voltage-limiting device may be configured to limit a $V_{GS}$ of the first transistor when forward biased, such that the first transistor operates in a sub-threshold region.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for sourcing or sinking a current may comprise a current-limiting transistor, such as the NMOS transistor 212 or the PMOS transistor 222 depicted in FIG. 2. Means for limiting a gate-to-source voltage ($V_{GS}$) of a transistor may include a voltage-limiting device, such as a diode or a diode-connected transistor (e.g., PMOS transistor 224 or NMOS transistor 226 in FIG. 2).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A circuit, comprising:
a first transistor having a gate, a source connected with a first node of the circuit, and a drain connected with a second node of the circuit;
a voltage-limiting device connected between the gate and the source of the first transistor, wherein the voltage-limiting device, if forward biased, is configured to limit a gate-to-source voltage ($V_{GS}$) of the first transistor such that the first transistor operates in a sub-threshold region;
a second transistor configured to bias the voltage-limiting device with a current, wherein:
a drain of the second transistor is connected with the gate of the first transistor;
a gate of the second transistor is connected with the first node; and
a source of the second transistor is connected with an electric potential; and
a third transistor connected in parallel with the first transistor, wherein a gate of the third transistor is configured to receive a control signal to bias the third transistor in a saturation region to bypass the first transistor.

2. The circuit of claim 1, wherein the voltage-limiting device comprises a diode-connected transistor.

3. The circuit of claim 2, wherein a gate and a drain of the diode-connected transistor are connected with the gate of the first transistor and wherein a source of the diode-connected transistor is connected with the source of the first transistor.

4. The circuit of claim 3, wherein the source and a bulk of the diode-connected transistor are connected together.

5. The circuit of claim 1, wherein the source and a bulk of the first transistor are connected together.

6. The circuit of claim 1, wherein a bulk and a source of the third transistor are connected together.

7. The circuit of claim 1, further comprising a capacitor connected between the second node and an electrical ground.

8. The circuit of claim 7, wherein the circuit comprises a filter, wherein the first node is an input of the filter, and wherein the second node is an output of the filter.

9. The circuit of claim 1, wherein the electric potential is an electrical ground.

10. The circuit of claim 1, wherein the electric potential is a power supply voltage.

11. The circuit of claim 1, wherein the first transistor is a PMOS transistor.

12. The circuit of claim 11, wherein the voltage-limiting device comprises a diode-connected PMOS transistor.

13. The circuit of claim 12, wherein the second transistor is an NMOS transistor.

14. The circuit of claim 11, wherein the voltage-limiting device comprises a diode having an anode connected with the source of the first transistor and a cathode connected with the gate of the first transistor.

15. The circuit of claim 1, wherein the first transistor is an NMOS transistor.

16. The circuit of claim 15, wherein the voltage-limiting device comprises a diode-connected NMOS transistor.

17. The circuit of claim 16, wherein the second transistor is a PMOS transistor.

18. The circuit of claim 15, wherein the voltage-limiting device comprises a diode having an anode connected with the gate of the first transistor and a cathode connected with the source of the first transistor.

19. A method, comprising:
receiving a signal at a first node of a circuit, the first node connected with a source of a first transistor, the first transistor having a gate, and a drain connected with a second node of the circuit;
controlling a second transistor to source or sink a current, wherein:
a drain of the second transistor is connected with the gate of the first transistor;
a gate of the second transistor is connected with the first node of the circuit; and
a source of the second transistor is connected with an electric potential;
forward biasing a voltage-limiting device with the current, wherein the voltage-limiting device is connected between the gate and the source of the first transistor and wherein the voltage-limiting device is configured to limit a gate-to-source voltage ($V_{GS}$) of the first transistor when forward biased, such that the first transistor operates in a sub-threshold region; and
receiving a control signal to bias a third transistor, connected in parallel with the first transistor, in a saturation region to bypass the first transistor, wherein a bulk and a source of the third transistor are connected together.

20. The method of claim 19, wherein the voltage-limiting device comprises a diode-connected transistor.

21. The method of claim 20, wherein a gate and a drain of the diode-connected transistor are connected with the gate of the first transistor and wherein a source of the diode-connected transistor is connected with the source of the first transistor.

22. The method of claim 21, wherein the source and a bulk of the diode-connected transistor are connected together and wherein the source and a bulk of the first transistor are connected together.

23. The method of claim 19, wherein the first transistor is a PMOS transistor, wherein the voltage-limiting device comprises a diode-connected PMOS transistor, and wherein the second transistor is an NMOS transistor.

24. The method of claim 19, wherein the first transistor is an NMOS transistor, wherein the voltage-limiting device comprises a diode-connected NMOS transistor, and wherein the second transistor is a PMOS transistor.

25. A circuit, comprising:
a first n-channel metal oxide semiconductor (NMOS) field-effect transistor (FET) of an identical transistor pair having a source of the first NMOS FET connected to a reference voltage node, a drain of the first NMOS FET connected to a gate of the first NMOS FET, and the drain configured to receive an input reference current;
a second NMOS FET of the identical transistor pair having a source connected to electrical ground, a gate and a drain configured to provide an output current;
a first transistor having a gate, a source connected with the gate of the first NMOS FET, and a drain connected with the gate of the second NMOS FET;
a voltage-limiting device connected between the gate and the source of the first transistor, wherein the voltage-limiting device, if forward biased, is configured to limit a gate-to-source voltage ($V_{GS}$) of the first transistor such that the first transistor operates in a sub-threshold region;
a current limiting transistor configured to provide a bias current to the voltage-limiting device, wherein:
a drain of the current limiting transistor is connected with the gate of the first transistor;
a gate of the current limiting transistor is connected with the gate of the first NMOS FET; and
a source of the current limiting transistor is connected with an electric potential node; and
a third transistor connected in parallel with the first transistor, wherein a gate of the third transistor is configured to receive a control signal to bias the third transistor in a saturation region to bypass the first transistor.

* * * * *